(12) United States Patent
Yun

(10) Patent No.: US 12,067,252 B2
(45) Date of Patent: Aug. 20, 2024

(54) STORAGE DEVICE WRITING DATA ON THE BASIS OF TEMPERATURES OF MEMORY DIES AND METHOD THEREOF

(71) Applicant: SK hynix Inc., Icheon (KR)

(72) Inventor: Jang Hun Yun, Icheon (KR)

(73) Assignee: SK hynix Inc., Icheon (KR)

( * ) Notice: Subject to any disclaimer, the term of this patent is extended or adjusted under 35 U.S.C. 154(b) by 17 days.

(21) Appl. No.: 18/163,073

(22) Filed: Feb. 1, 2023

(65) Prior Publication Data

US 2024/0143185 A1  May 2, 2024

(30) Foreign Application Priority Data

Oct. 26, 2022  (KR) .................. 10-2022-0139015

(51) Int. Cl.
 *G06F 3/06* (2006.01)
(52) U.S. Cl.
 CPC .......... *G06F 3/0616* (2013.01); *G06F 3/0653* (2013.01); *G06F 3/0659* (2013.01); *G06F 3/0673* (2013.01)

(58) Field of Classification Search
 CPC .... G06F 3/0616; G06F 3/0653; G06F 3/0659; G06F 3/0673
 See application file for complete search history.

(56) References Cited

U.S. PATENT DOCUMENTS

| 10,803,921 B2 | 10/2020 | McVay |
| 11,016,545 B2 | 5/2021 | Yang et al. |
| 2016/0162219 A1* | 6/2016 | Erez .................. G11C 7/04 711/103 |

FOREIGN PATENT DOCUMENTS

KR    10-2012-0057285 A    6/2012

* cited by examiner

*Primary Examiner* — Jae U Yu

(57) ABSTRACT

Upon determining that a reference condition is satisfied, a storage device may determine target memory dies among a plurality of memory dies included in the storage device on the basis of temperatures of the plurality of memory dies, and then write data according to the determination of the target memory dies. For example, the storage device may write data to the target memory dies in an interleaving manner, may write data to a memory die that is not a target memory die only when data is not being written to any other of the plurality of memory dies, or both. The reference condition may relate to a temperature of the storage device.

15 Claims, 11 Drawing Sheets

STORAGE DEVICE WRITING DATA ON THE BASIS OF TEMPERATURES OF MEMORY DIES AND METHOD THEREOF

CROSS-REFERENCE TO RELATED APPLICATION

The present application claims priority under 35 U.S.C. § 119(a) to Korean Patent Application No. 10-2022-0139015 filed on Oct. 26, 2022, which is incorporated herein by reference in its entirety.

BACKGROUND

1. Technical Field

Various embodiments generally relate to a storage device which writes data on the basis of the temperatures of memory dies, and a method thereof.

2. Related Art

A storage device is a device which stores data on the basis of a request of a host such as a computer, a mobile terminal such as a smartphone and a tablet, or various electronic devices.

The storage device may include a controller for controlling a memory (e.g., a volatile memory/a nonvolatile memory). The controller may receive a command from the host, and may execute or control an operation for reading, writing or erasing data with respect to the memory included in the storage device, on the basis of the received command.

When the temperature of the storage device rises, the storage device may lower the temperature of the storage device by delaying (i.e., throttling) a background operation or an inputted command. This is to prevent the malfunction of the storage device.

SUMMARY

Various embodiments are directed to a storage device capable of normally maintaining the temperatures of a plurality of dies included in a memory, by efficiently performing an operation of writing data depending on the temperatures of the plurality of dies, and a method thereof.

In an embodiment, a storage device may include: i) a plurality of memory dies; and ii) a controller configured to determine whether a reference condition is satisfied, and in response to determining that the reference condition is satisfied, determine one or more target memory dies among the plurality of memory dies on the basis of temperatures of the plurality of memory dies, and write data to the plurality of memory dies according to the determination of the target memory dies in an interleaving manner.

In an embodiment, a method for operating a storage device may include: i) measuring temperatures of a plurality of memory dies, ii) determining whether a reference condition is satisfied; iii) in response to determining that the reference condition is satisfied, determining one or more target memory dies on the basis of the measured temperatures; and writing data to the target memory dies in an interleaving manner according to the determination of the one or more target memory dies.

In an embodiment, a controller may include: i) a memory interface configured to communicate with a memory, the memory including a plurality of memory dies; and ii) a control logic configured to obtain measurements of temperatures respectively corresponding to the plurality of memory dies, determine whether a reference condition is satisfied, and in response to the reference condition being satisfied, write a plurality of data units in parallel to memory dies whose temperatures are lower than a threshold die temperature among the plurality of memory dies.

According to the embodiments of the disclosed technology, it is possible to normally maintain the temperatures of a plurality of dies included in a memory, by efficiently performing an operation of writing data depending on the temperatures of the plurality of dies.

DETAILED DESCRIPTION

Figure 1:
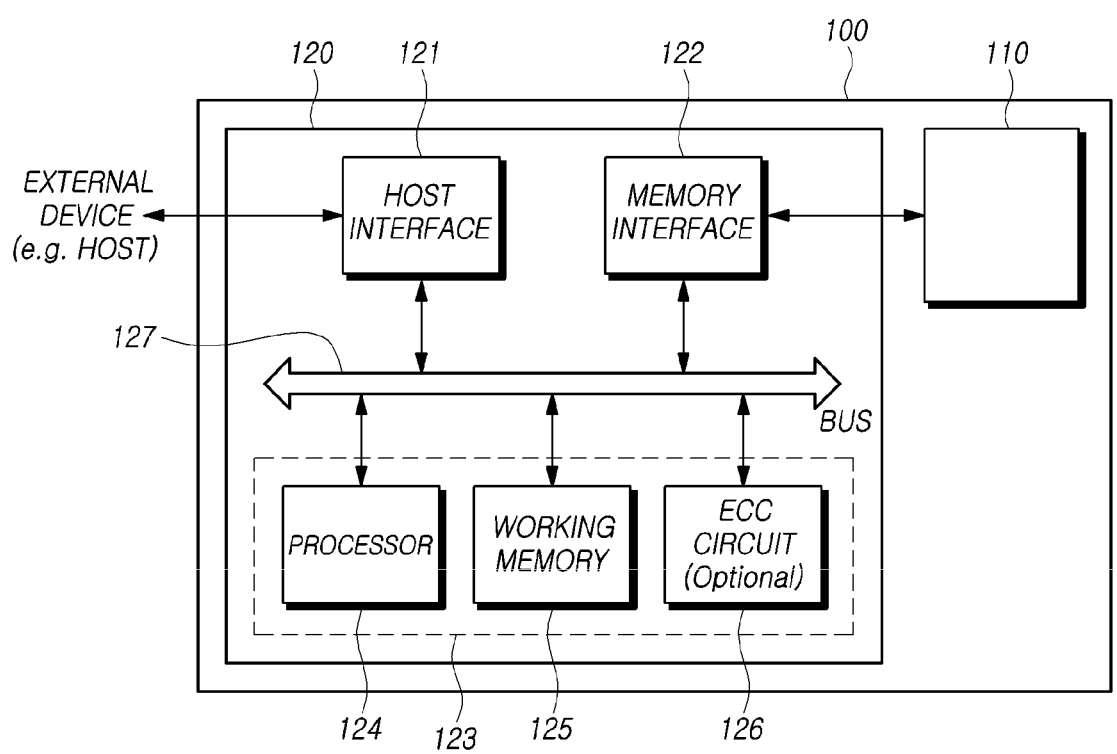
FIG. 1 is a schematic configuration diagram of a storage device based on an embodiment of the disclosed technology.

Hereinafter, embodiments of the present disclosure are described in detail with reference to the accompanying drawings. Throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

Various embodiments of the present invention are described below in more detail with reference to the accompanying drawings. However, the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods disclosed herein.

When implemented at least partially in software, the controllers, processors, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device.

FIG. 1 is a schematic configuration diagram of a storage device 100 based on an embodiment of the disclosed technology.

Referring to FIG. 1, the storage device 100 based on the embodiment of the disclosed technology may include a memory 110 which stores data, and a controller 120 which controls the memory 110.

The memory 110 includes a plurality of memory blocks, and operates in response to the control of the controller 120. Operations of the memory 110 may include, for example, a read operation, a program operation (also referred to as a write operation) and an erase operation.

The memory 110 may include a memory cell array including a plurality of memory cells (also simply referred to as "cells") which store data. Such a memory cell array may exist in a memory block.

For example, the memory 110 may be implemented into various types such as a NAND flash memory, a 3D NAND flash memory, a NOR flash memory, a resistive random access memory (RRAM), a phase-change random access memory (PRAM), a magnetoresistive random access memory (MRAM), a ferroelectric random access memory (FRAM) and a spin transfer torque random access memory (STT-RAM).

The memory 110 may be implemented as a three-dimensional array structure. The embodiment of the disclosed technology may be applied to not only a flash memory in which a charge storage layer is configured by a conductive floating gate but also a charge trap flash (CTF) in which a charge storage layer is configured by a dielectric layer.

The memory 110 may receive a command and an address from the controller 120 and may access an area which is selected by the address in the memory cell array. In other words, the memory 110 may perform an operation indicated by the command, on the area selected by the address.

For example, the memory 110 may perform a program operation, a read operation and an erase operation. In this connection, when performing the program operation, the memory 110 may program data to the area selected by the address. When performing the read operation, the memory 110 may read data from the area selected by the address. In the erase operation, the memory 110 may erase data stored in the area selected by the address.

The controller 120 may control write (program), read, erase and background operations for the memory 110. For example, the background operation may include at least one among a garbage collection (GC) operation, a wear leveling (WL) operation, a read reclaim (RR) operation, a bad block management (BBM) operation, and so forth.

The controller 120 may control the operation of the memory 110 according to a request from a device (e.g., a host) located outside the storage device 100. On the other hand, the controller 120 may control the operation of the memory 110 regardless of a request of the host.

The host may be a computer, an ultra mobile PC (UMPC), a workstation, a personal digital assistant (PDA), a tablet, a mobile phone, a smartphone, an e-book, a portable multimedia player (PMP), a portable game player, a navigation device, a black box, a digital camera, a digital multimedia broadcasting (DMB) player, a smart television, a digital audio recorder, a digital audio player, a digital picture recorder, a digital picture player, a digital video recorder, a digital video player, a storage configuring a data center, one of various electronic devices configuring a home network, one of various electronic devices configuring a computer network, one of various electronic devices configuring a telematics network, an RFID (radio frequency identification) device, a mobility device (e.g., a vehicle, a robot or a drone) capable of traveling under human control or autonomous driving, etc.

The host may include at least one operating system (OS). The operating system may generally manage and control the function and operation of the host, and may provide interoperability between the host and the storage device 100. The operating system may be classified into a general operating system and a mobile operating system depending on the mobility of the host.

The controller 120 and the host may be devices which are separated from each other. As the case may be, the controller 120 and the host may be implemented by being integrated into one device. Hereunder, for the sake of convenience in explanation, an example is described in which the controller 120 and the host are devices which are separated from each other.

Referring to FIG. 1, the controller 120 may include a memory interface 122 and a control circuit 123, and may further include a host interface 121.

The host interface 121 provides an interface for communication with the host. For example, the host interface 121 provides an interface which uses at least one among various interface protocols such as a USB (universal serial bus) protocol, an MMC (multimedia card) protocol, a PCI (peripheral component interconnection) protocol, a PCI-E (PCI-express) protocol, an ATA (advanced technology attachment) protocol, a serial-ATA protocol, a parallel-ATA protocol, an SCSI (small computer system interface) protocol, an ESDI (enhanced small disk interface) protocol, an SMBus (system management bus) protocol, an I2C (inter-integrated circuit) protocol, an I3C (improved inter-integrated circuit) protocol, an IDE (integrated drive electronics) protocol and a private protocol.

When receiving a command from the host, the control circuit 123 may receive the command through the host interface 121, and may perform an operation of processing the received command.

The memory interface 122 may be coupled with the memory 110 to provide an interface for communication with the memory 110. That is to say, the memory interface 122 may be configured to provide an interface between the memory 110 and the controller 120 in response to the control of the control circuit 123.

The control circuit 123 performs the general control operation of the controller 120 to control the operation of the memory 110. To this end, for instance, the control circuit 123 may include at least one of a processor 124 and a working memory 125, and may optionally include an error detection and correction circuit (ECC circuit) 126.

The processor 124 may control general operations of the controller 120, and may perform a logic calculation. The processor 124 may communicate with the host through the host interface 121, and may communicate with the memory 110 through the memory interface 122.

The processor 124 may perform the function of a flash translation layer (FTL). The processor 124 may translate a logical block address (LBA), provided by the host, into a physical block address (PBA) through the flash translation layer (FTL). The flash translation layer (FTL) may receive the logical block address (LBA) and translate the logical block address (LBA) into the physical block address (PBA), by using a mapping table.

There are various address mapping methods of the flash translation layer, depending on a mapping unit. Representative address mapping methods include a page mapping method, a block mapping method and a hybrid mapping method.

The processor 124 may randomize data received from the host. For example, the processor 124 may randomize data received from the host, by using a set randomizing seed. The randomized data may be provided to the memory 110, and may be programmed to a memory cell array of the memory 110.

In a read operation, the processor 124 may derandomize data received from the memory 110. For example, the processor 124 may derandomize data received from the memory 110, by using a derandomizing seed. The derandomized data may be outputted to the host.

The processor 124 may execute firmware to control the operation of the controller 120. Namely, in order to control the general operation of the controller 120 and perform a logic calculation, the processor 124 may execute (drive) firmware loaded in the working memory 125 upon booting. Hereafter, an operation of the storage device 100 to be described based on the embodiment of the disclosed technology may be implemented in such a way that the processor 124 executes firmware in which the corresponding operation is defined.

Firmware, as a program to be executed in the storage device 100 to drive the storage device 100, may include various functional layers. For example, the firmware may include binary data in which codes for executing the functional layers, respectively, are defined.

For example, the firmware may include at least one among a flash translation layer (FTL) which performs a translating function between a logical address received by the storage device 100 from the host and a physical address of the memory 110, a host interface layer (HIL) which serves to analyze a command received by the storage device 100 as a storage device from the host and transfer the command to the flash translation layer (FTL), and a flash interface layer (FIL) which transfers a command, produced by the flash translation layer (FTL), to the memory 110.

Such firmware may be loaded in the working memory 125 from, for example, the memory 110 or a separate nonvolatile memory (e.g., a ROM or a NOR Flash) located outside the memory 110. The processor 124 may first load all or a part of the firmware in the working memory 125 when executing a booting operation after power-on.

The processor 124 may perform a logic calculation which is defined in the firmware loaded in the working memory 125, to control the general operation of the controller 120. The processor 124 may store a result of performing the logic calculation defined in the firmware, in the working memory 125. The processor 124 may control the controller 120 according to a result of performing the logic calculation defined in the firmware such that the controller 120 generates a command or a signal. When a part of firmware in which a logic calculation to be performed is defined is stored in the memory 110 but is not loaded in the working memory 125, the processor 124 may generate an event (e.g., an interrupt) for loading the corresponding part of the firmware into the working memory 125 from the memory 110.

The processor 124 may load metadata necessary for driving firmware, from the memory 110. The metadata, as data for managing the memory 110, may include management information on user data stored in the memory 110.

Firmware may be updated when the storage device 100 is manufactured or while the storage device 100 is operating. The controller 120 may download new firmware from the outside of the storage device 100 and update existing firmware with the new firmware.

The working memory 125 may store firmware, a program code, a command and data which are necessary to drive the controller 120. Such a working memory 125 as, for example, a volatile memory may include at least one among an SRAM (static RAM), a DRAM (dynamic RAM) and an SDRAM (synchronous DRAM).

The error detection and correction circuit 126 may detect an error bit of target data and correct the detected error bit, by using an error correction code. The target data may be, for example, data stored in the working memory 125 or data read from the memory 110.

The error detection and correction circuit 126 may be implemented to decode data by using an error correction code. The error detection and correction circuit 126 may be implemented by various code decoders. For example, a decoder which performs unsystematic code decoding or a decoder which performs systematic code decoding may be used.

For example, the error detection and correction circuit 126 may detect an error bit by the unit of a set sector in each of read data. Namely, each read data may be constituted by a plurality of sectors. A sector may mean a data unit smaller than a page being the read unit of a flash memory. Sectors constituting each read data may be matched with one another by the medium of an address.

The error detection and correction circuit 126 may calculate a bit error rate (BER), and may determine whether an error is correctable or not, in the unit of sector. For example, when a bit error rate (BER) is higher than a set reference value, the error detection and correction circuit 126 may determine that a corresponding sector is uncorrectable or a fail. On the other hand, when a bit error rate (BER) is lower than the reference value, the error detection and correction circuit 126 may determine that a corresponding sector is correctable or a pass.

The error detection and correction circuit 126 may perform an error detection and correction operation sequentially for all read data. In the case where a sector included in read data is correctable, the error detection and correction circuit 126 may omit an error detection and correction operation for a corresponding sector for next read data. If the error detection and correction operation for all read data is ended in this way, the error detection and correction circuit 126 may detect a sector which is determined to be uncorrectable to the last. There may be one or more sectors that are determined to be uncorrectable. The error detection and correction circuit 126 may transfer information (for example, address information) on a sector which is determined to be uncorrectable, to the processor 124.

A bus 127 may be configured to provide channels among the components 121, 122, 124, 125 and 126 of the controller 120. The bus 127 may include, for example, a control bus for transferring various control signals, commands and the likes, a data bus for transferring various data, and so forth.

Some components among the above-described components 121, 122, 124, 125 and 126 of the controller 120 may be omitted, or some components among the above-described components 121, 122, 124, 125 and 126 of the controller 120 may be integrated into one component. As the case may be, in addition to the above-described components 121, 122, 124, 125 and 126 of the controller 120, one or more other components may be added.

Hereinbelow, the memory 110 will be described in further detail with reference to FIG. 2.

Figure 2:
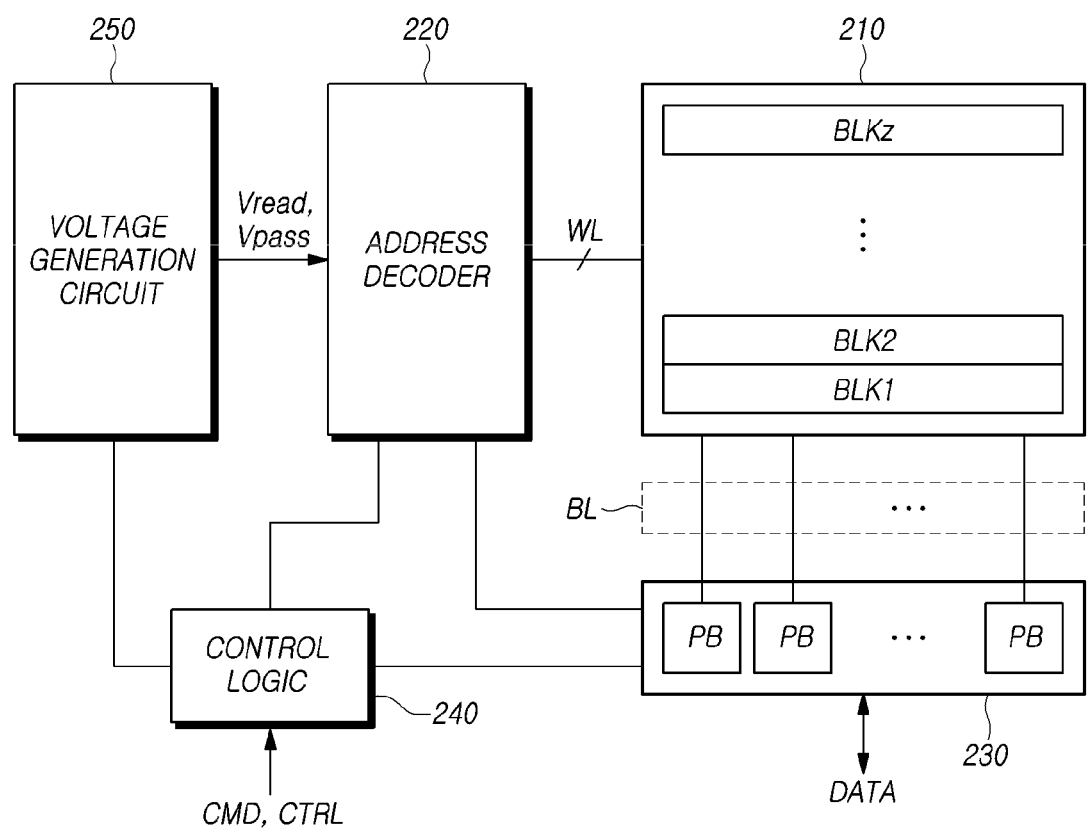
FIG. 2 is a block diagram schematically illustrating a memory of FIG. 1.

FIG. 2 is a diagram schematically illustrating the memory 110 of FIG. 1.

Referring to FIG. 2, the memory 110 based on an embodiment of the disclosed technology may include a memory cell array 210, an address decoder 220, a read and write circuit 230, a control logic 240, and a voltage generation circuit 250.

The memory cell array 210 may include a plurality of memory blocks BLK1 to BLKz (z is a natural number of 2 or greater).

In the plurality of memory blocks BLK1 to BLKz, a plurality of word lines WL and a plurality of bit lines BL may be disposed, and a plurality of memory cells (MC) may be arranged.

The plurality of memory blocks BLK1 to BLKz may be coupled with the address decoder 220 through the plurality of word lines WL. The plurality of memory blocks BLK1 to BLKz may be coupled with the read and write circuit 230 through the plurality of bit lines BL.

Each of the plurality of memory blocks BLK1 to BLKz may include a plurality of memory cells. For example, the plurality of memory cells may be nonvolatile memory cells, and may be configured by nonvolatile memory cells which have vertical channel structures.

The memory cell array 210 may be configured by a memory cell array of a two-dimensional structure, or as the case may be, may be configured by a memory cell array of a three-dimensional structure.

Each of the plurality of memory cells included in the memory cell array 210 may store at least 1-bit data. For instance, each of the plurality of memory cells included in the memory cell array 210 may be a signal level cell (SLC) which stores 1-bit data. For another instance, each of the plurality of memory cells included in the memory cell array 210 may be a multi-level cell (MLC) which stores 2-bit data. For still another instance, each of the plurality of memory cells included in the memory cell array 210 may be a triple level cell (TLC) which stores 3-bit data. For yet another instance, each of the plurality of memory cells included in the memory cell array 210 may be a quad level cell (QLC) which stores 4-bit data. For still yet another instance, the memory cell array 210 may include a plurality of memory cells, each of which stores 5 or more-bit data.

The number of bits of data stored in each of the plurality of memory cells may be dynamically determined. For example, a single-level cell which stores 1-bit data may be changed to a triple-level cell which stores 3-bit data.

Referring to FIG. 2, the address decoder 220, the read and write circuit 230, the control logic 240 and the voltage generation circuit 250 may operate as a peripheral circuit which drives the memory cell array 210.

The address decoder 220 may be coupled to the memory cell array 210 through the plurality of word lines WL.

The address decoder 220 may be configured to operate in response to the control of the control logic 240.

The address decoder 220 may receive an address through an input/output buffer in the memory 110. The address decoder 220 may be configured to decode a block address in the received address. The address decoder 220 may select at least one memory block depending on the decoded block address.

The address decoder 220 may receive a read voltage Vread and a pass voltage Vpass from the voltage generation circuit 250.

The address decoder 220 may apply the read voltage Vread to a selected word line WL in a selected memory block in a read voltage applying operation during a read operation, and may apply the pass voltage Vpass to the remaining unselected word lines WL.

The address decoder 220 may apply a verify voltage generated in the voltage generation circuit 250 to a selected word line WL in a selected memory block in a program verify operation, and may apply the pass voltage Vpass to the remaining unselected word lines WL.

The address decoder 220 may be configured to decode a column address in the received address. The address decoder 220 may transmit the decoded column address to the read and write circuit 230.

A read operation and a program operation of the memory 110 may be performed by the unit of a page. An address received when a read operation or a program operation is requested may include at least one among a block address, a row address and a column address.

The address decoder 220 may select one memory block and one word line depending on a block address and a row address. A column address may be decoded by the address decoder 220 and be provided to the read and write circuit 230.

The address decoder 220 may include at least one among a block decoder, a row decoder, a column decoder and an address buffer.

The read and write circuit 230 may include a plurality of page buffers PB. The read and write circuit 230 may operate as a read circuit in a read operation of the memory cell array 210, and may operate as a write circuit in a write operation of the memory cell array 210.

The read and write circuit 230 described above may also be referred to as a page buffer circuit or a data register circuit which includes a plurality of page buffers PB. The read and write circuit 230 may include data buffers which take charge of a data processing function, and as the case may be, may further include cache buffers which take charge of a caching function.

The plurality of page buffers PB may be coupled to the memory cell array 210 through the plurality of bit lines BL. The plurality of page buffers PB may continuously supply sensing current to bit lines BL coupled with memory cells to sense threshold voltages (Vth) of the memory cells in a read operation and a program verify operation, and may latch sensing data by sensing, through sensing nodes, that the amounts of current flowing depending on the programmed states of the corresponding memory cells are changed.

The read and write circuit 230 may operate in response to page buffer control signals outputted from the control logic 240.

In a read operation, the read and write circuit 230 temporarily stores read data by sensing data of memory cells, and then, outputs data DATA to the input/output buffer of the memory 110. As an exemplary embodiment, the read and write circuit 230 may include a column select circuit and so forth in addition to the page buffers PB or the page registers.

The control logic 240 may be coupled with the address decoder 220, the read and write circuit 230 and the voltage generation circuit 250. The control logic 240 may receive a command CMD and a control signal CTRL through the input/output buffer of the memory 110.

The control logic 240 may be configured to control general operations of the memory 110 in response to the control signal CTRL. The control logic 240 may output control signals for adjusting the precharge potential levels of the sensing nodes of the plurality of page buffers PB.

The control logic 240 may control the read and write circuit 230 to perform a read operation of the memory cell array 210. The voltage generation circuit 250 may generate the read voltage Vread and the pass voltage Vpass used in a read operation, in response to a voltage generation circuit control signal outputted from the control logic 240.

Each memory block of the memory 110 described above may be configured by a plurality of pages corresponding to a plurality of word lines WL and a plurality of strings corresponding to a plurality of bit lines BL.

In a memory block BLK, a plurality of word lines WL and a plurality of bit lines BL may be disposed to intersect with each other. For example, each of the plurality of word lines WL may be disposed in a row direction, and each of the plurality of bit lines BL may be disposed in a column direction. For another example, each of the plurality of word lines WL may be disposed in a column direction, and each of the plurality of bit lines BL may be disposed in a row direction.

A memory cell which is coupled to one of the plurality of word lines WL and one of the plurality of bit lines BL may be defined. A transistor may be disposed in each memory cell.

For example, a transistor disposed in each memory cell (MC) may include a drain, a source and a gate. The drain (or source) of the transistor may be coupled with a corresponding bit line BL directly or via another transistor. The source (or drain) of the transistor may be coupled with a source line (which may be the ground) directly or via another transistor. The gate of the transistor may include a floating gate which is surrounded by a dielectric and a control gate to which a gate voltage is applied from a word line WL.

In each memory block, a first select line (also referred to as a source select line or a drain select line) may be additionally disposed outside a first outermost word line more adjacent to the read and write circuit 230 between two outermost word lines, and a second select line (also referred to as a drain select line or a source select line) may be additionally disposed outside a second outermost word line between the two outermost word lines.

As the case may be, at least one dummy word line may be additionally disposed between the first outermost word line and the first select line. At least one dummy word line may also be additionally disposed between the second outermost word line and the second select line.

A read operation and a program operation (write operation) of the memory block described above may be performed by the unit of a page, and an erase operation may be performed by the unit of a memory block.

Figure 3:
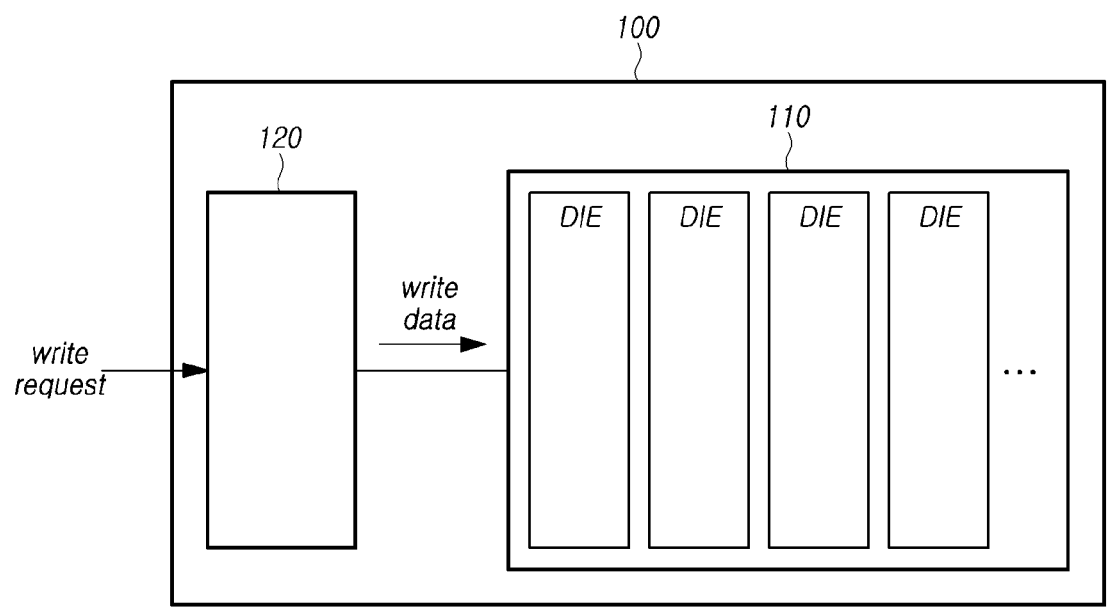
FIG. 3 illustrates the schematic structure of a storage device based on an embodiment of the disclosed technology.

FIG. 3 illustrates the schematic structure of a storage device 100 based on an embodiment of the disclosed technology.

The storage device 100 may include a memory 110 and a controller 120.

The memory 110 may include a plurality of memory dies DIE. Each of the plurality of memory dies DIE may include one or more of the memory blocks described above. The plurality of memory dies DIE may have different operating characteristics.

The controller 120 may write data to the plurality of memory dies DIE. The data may be data write-requested from the outside of the storage device 100 (e.g., data write-requested from a host).

For example, the controller 120 may write data to any one of memory blocks included in the plurality of memory dies DIE. When the controller 120 writes data to a memory block, the data may be written in units of pages included in the corresponding memory block.

In the embodiment of the disclosed technology, when it is determined that a set reference condition is satisfied, the controller 120 may determine memory dies DIE to which data is to be written, among the plurality of memory dies DIE on the basis of the temperatures of the plurality of memory dies DIE.

To this end, the controller 120 may obtain measurements of the temperatures of the plurality of memory dies DIE. The controller 120 may obtain measurements of the temperatures of the plurality of memory dies DIE after receiving data to be written, or may use previously obtained measured temperatures of the plurality of memory dies DIE.

For example, in order to measure the temperatures of the plurality of memory dies DIE, the controller 120 may use a temperature sensor (not illustrated) corresponding to each of the plurality of memory dies DIE, which temperature sensors may be included in the memory 110. In another example, each temperature sensors may be within corresponding memory die and the controller 120 may obtain temperature measurements of the plurality of memory dies DIE from respective temperature sensors within the plurality of memory dies DIE.

Figure 4:
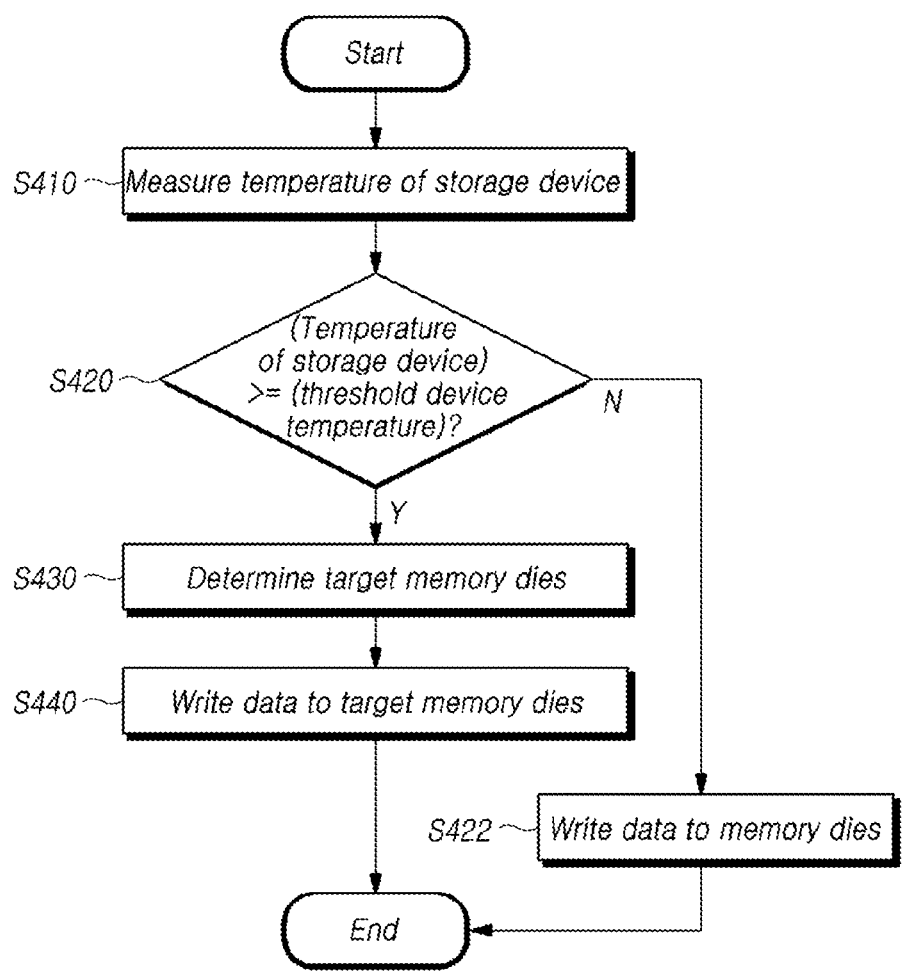
FIG. 4 is a flowchart illustrating an example of the operation of the storage device based on the embodiment of the disclosed technology.

FIG. 4 is a flowchart illustrating an example of the operation of the storage device 100 based on the embodiment of the disclosed technology.

Referring to FIG. 4, the controller 120 of the storage device 100 may obtain a measurement of the temperature of the storage device 100 (S410). In an example embodiment, the controller 120 may measure the temperature of the storage device 100 using a temperature sensor (not illustrated) inside the controller 120, which temperature sensor may be different from the temperature sensors corresponding to each of the plurality of memory dies DIE. In another example embodiment, the controller 120 may obtain a measurement of the temperature of the storage device 100 using one or more of the temperature sensors corresponding to each of the plurality of memory dies DIE, such as by determining the temperature of the storage device 100 based on a temperature of a predetermined one of those sensors, based on an average, a median or weighted average of temperatures of those sensors, or based on a maximum or minimum temperatures of those sensors.

For example, a temperature value measured by the temperature sensor (not illustrated) inside the controller 120 may be stored in a preset register. The controller 120 may measure the temperature of the storage device 100 by reading a value stored in the corresponding register.

The controller 120 determines whether the temperature of the storage device 100 measured at the step S410 is equal to or higher than a set threshold device temperature (S420).

In response to determining that the temperature of the storage device 100 is equal to or higher than the threshold device temperature (S420-Y), the controller 120 may determine one or more target memory dies DIE on the basis of the temperatures of the plurality of memory dies DIE (S430). For example, the controller 120 may store information (e.g., IDs) for identifying the determined target memory dies DIE in the working memory 125 in the controller 120 or in the memory 110.

The controller 120 may write data to the target memory dies DIE (S440).

In this case, the reference condition is whether the temperature of the storage device 100 is equal to or higher than the threshold device temperature. That is to say, when the temperature of the storage device 100 is equal to or higher than the threshold device temperature, the controller 120 may determine that the reference condition is satisfied.

On the other hand, in response to determining that the temperature of the storage device 100 is lower than the threshold device temperature (S420-N), the controller 120 may write date to any or all of the plurality of memory dies DIE (S422).

Figure 5:
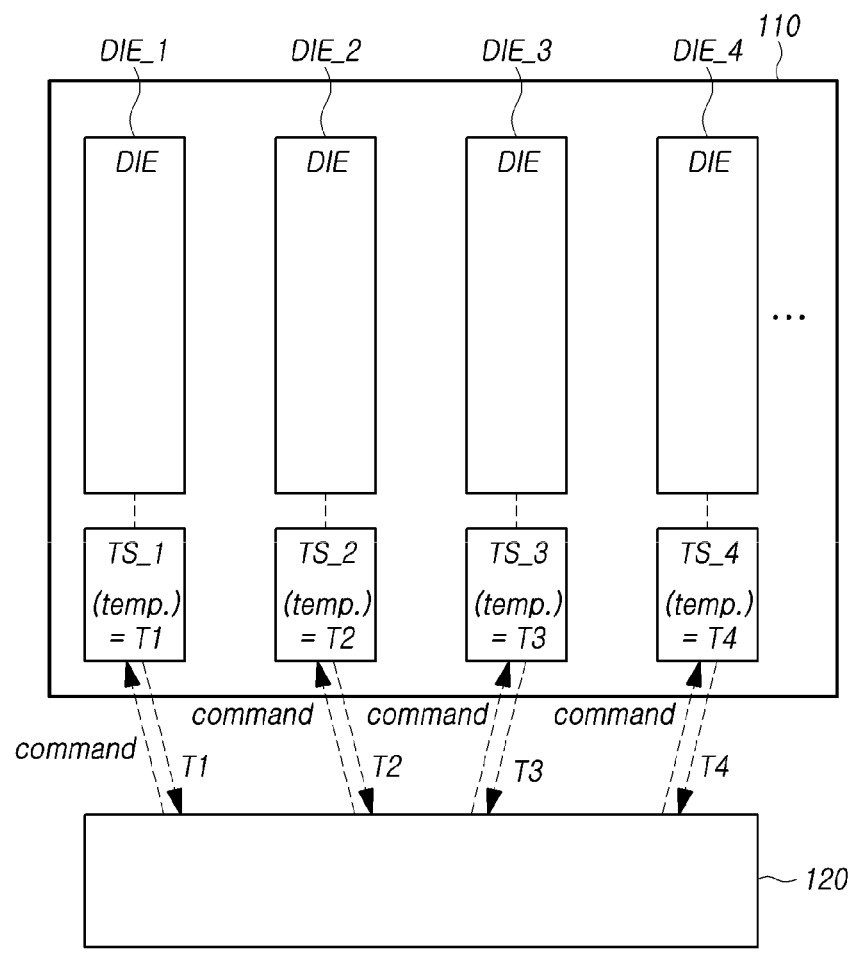
FIG. 5 illustrates an example of a plurality of memory dies based on the embodiment of the disclosed technology.

FIG. 5 illustrates an example of a plurality of memory dies DIE based on the embodiment of the disclosed technology.

Referring to FIG. 5, the memory 110 may include first through fourth memory dies DIE_1 through DIE_4. Respective temperatures measured for the memory dies DIE_1 through DIE_4 may be different from one another. Hereinafter, the content of the disclosed technology will be described using an example in which the memory 110 includes four memory dies DIE_1 through DIE_4.

However, embodiments are not limited to cases where the number of memory dies DIE included in the memory 110 is four, and any number of memory dies DIE may be included in the memory 110. For example, the number of memory dies DIE included in the memory 110 may be eight, 16 or 32.

In FIG. 5, the temperature of a first memory die DIE_1 is T1, the temperature of a second memory die DIE_2 is T2, the temperature of a third memory die DIE_3 is T3, and the temperature of a fourth memory die DIE_4 is T4. As described above, the temperatures of the respective memory dies DIE_1, DIE_2, DIE_3, and DIE_4 may be measured through temperature sensors TS_1, TS_2, TS_3, and TS_4 corresponding to the respective memory dies DIE_1, DIE_2, DIE_3, and DIE_4. In some embodiments, the temperature sensors TS_1, TS_2, TS_3 and TS_4 may be external to and adjacent to the respective memory dies DIE_1, DIE_2, DIE_3, and DIE_4. In other embodiments, the temperature sensors TS_1, TS_2, TS_3 and TS_4 may be incorporated in the respective memory dies DIE_1, DIE_2, DIE_3, and DIE_4.

The controller 120 may obtain a temperature value of each memory die from a temperature sensor corresponding to each memory die. For example, the controller 120 may transmit a command requesting the temperature of the first memory die DIE_1 to a first temperature sensor TS_1, and may receive T1 as the temperature value of the first memory die DIE_1 from the first temperature sensor TS_1. For example, the controller 120 may transmit a command requesting the temperature of the second memory die DIE_2 to a second temperature sensor TS_2, and may receive T2 as the temperature value of the second memory die DIE_2 from the second temperature sensor TS_2. For example, the controller 120 may transmit a command requesting the temperature of the third memory die DIE_3 to a third temperature sensor TS_3, and may receive T3 as the temperature value of the third memory die DIE_3 from the third temperature sensor TS_3. For example, the controller 120 may transmit a command requesting the temperature of the fourth memory die DIE_4 to a fourth temperature sensor TS_4, and may receive T4 as the temperature value of the fourth memory die DIE_4 from the fourth temperature sensor TS_4.

The storage device 100 may determine the one or more target memory dies DIE in various ways. Hereinafter, operations in which the storage device 100 determines one or more target memory dies TGT_DIE will be described with reference to FIGS. 6 and 7.

Figure 6:
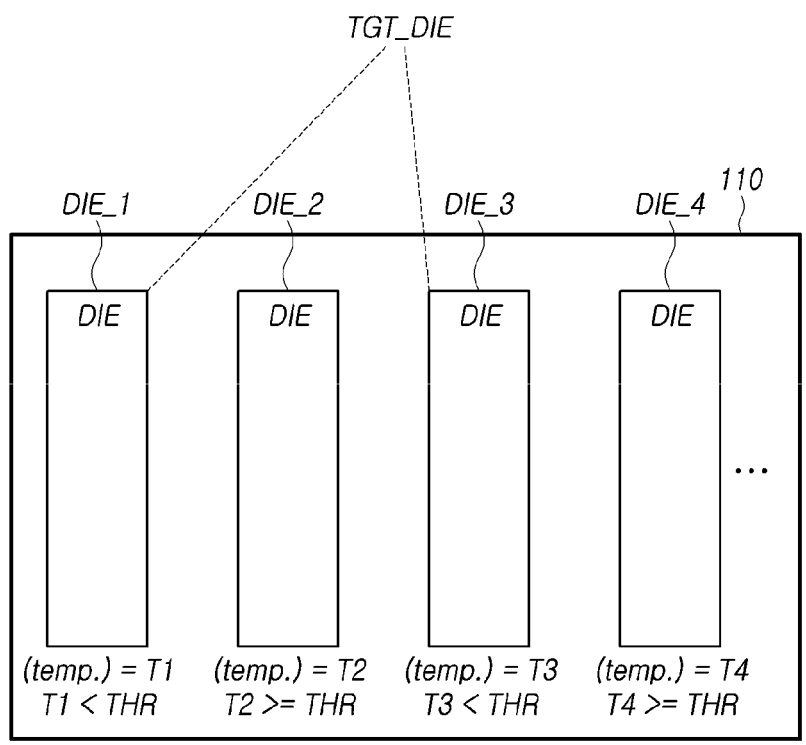
FIG. 6 illustrates an example in which the storage device based on the embodiment of the disclosed technology determines target memory dies.

FIG. 6 illustrates an example in which the storage device 100 based on the embodiment of the disclosed technology determines target memory dies TGT_DIE.

Referring to FIG. 6, the controller 120 of the storage device 100 may determine memory dies having respective temperatures lower than a set threshold temperature THR among the plurality of memory dies DIE, as target memory dies TGT_DIE.

In FIG. 6, the temperatures of the first memory die DIE_1 and the third memory die DIE_3 among the plurality of memory dies are lower than the threshold temperature THR. Accordingly, the controller 120 may determine the first memory die DIE_1 and the third memory die DIE_3 as the target memory dies TGT_DIE.

Figure 7:
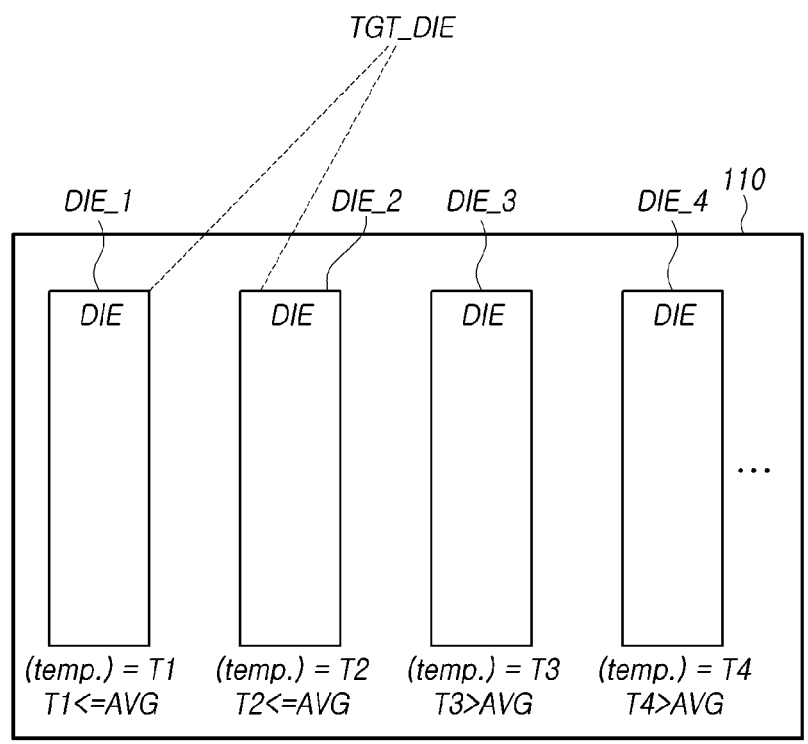
FIG. 7 illustrates another example in which the storage device based on the embodiment of the disclosed technology determines target memory dies.

FIG. 7 illustrates another example in which the storage device 100 based on the embodiment of the disclosed technology determines target memory dies TGT_DIE.

Referring to FIG. 7, the controller 120 of the storage device 100 may calculate an average temperature value AVG using at least one memory die among the plurality of memory dies, and may determine memory dies DIE whose temperatures are equal to or lower than the average temperature value AVG, as target memory dies TGT_DIE.

In FIG. 7, the temperatures of the first memory die DIE_1 and the second memory die DIE_2 among the plurality of memory dies DIE are equal to or lower than the average temperature value AVG of the plurality of memory dies. Accordingly, the controller 120 may determine the first memory die DIE_1 and the second memory die DIE_2 as the target memory dies TGT_DIE.

In some embodiments, the average temperature value AVG may be equal to the average of the temperatures of all of the plurality of memory dies, which in the example of FIG. 6 is calculated as $((T1+T2+T3+T4)/4)$. In other embodiments, a memory die whose temperature is equal to or higher than a set temperature (i.e., a limit temperature) among the plurality of memory dies may not be included in memory dies used in the process of calculating the average temperature value AVG. For example, in such an embodiment, when the temperature T4 of the fourth memory die DIE_4 among the plurality of memory dies is equal to or higher than the set limit temperature, the average temperature value AVG may be calculated as $((T1+T2+T3)/3)$.

In other embodiments, the storage device 100 may determine the target memory dies TGT_DIE using other ways. For example, the storage device 100 may determine M (M is a natural number) number of memory dies whose temperatures are lowest among the plurality of memory dies, as the target memory dies TGT_DIE.

Figure 8:
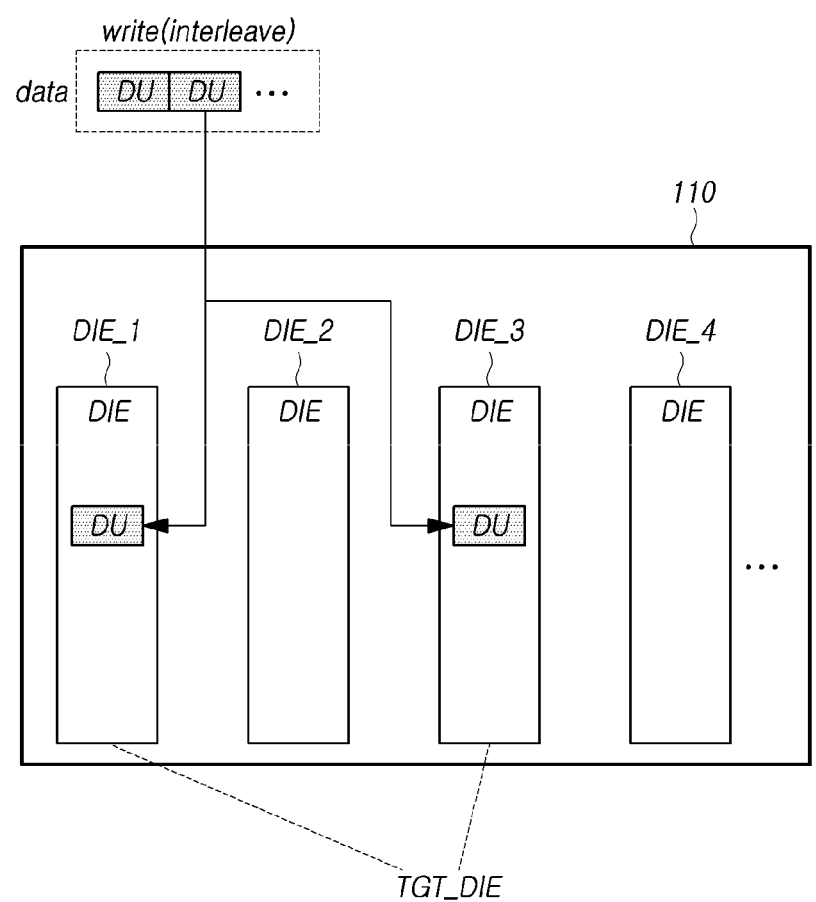
FIG. 8 illustrates an example in which data is written to target memory dies based on the embodiment of the disclosed technology.

FIG. 8 illustrates an example in which data is written to target memory dies TGT_DIE based on the embodiment of the disclosed technology.

Referring to FIG. 8, the controller 120 of the storage device 100 may write data to the target memory dies TGT_DIE among the plurality of memory dies DIE in an interleaving manner.

Writing data to the target memory dies TGT_DIE in an interleaving manner means that the data is divided into a plurality of data units DU and the plurality of divided data units DU are written in parallel by being distributed to the target memory dies TGT_DIE, respectively. The plurality of data units DU may be transmitted from the controller 120 to the target memory dies TGT_DIE through different channels, respectively. The plurality of data units DU may be simultaneously written to the target memory dies TGT_DIE, respectively, which are different from each other.

When the controller 120 writes data to the target memory dies TGT_DIE in the interleaving manner, the data may be written more quickly than when data is written solely to only one memory die DIE.

In FIG. 8, among the four memory dies DIE, the temperature T1 of the first memory die DIE_1 is lower than the threshold temperature THR, and the temperature T3 of the third memory die DIE_3 is lower than the threshold temperature THR.

Accordingly, the controller 120 may write data to the first memory die DIE_1 and the third memory die DIE_3 in the interleaving manner. The data unit DU to be written to the first memory die DIE_1 and the data unit DU to be written to the third memory die DIE_3 may be written in parallel as described above.

Figure 9:
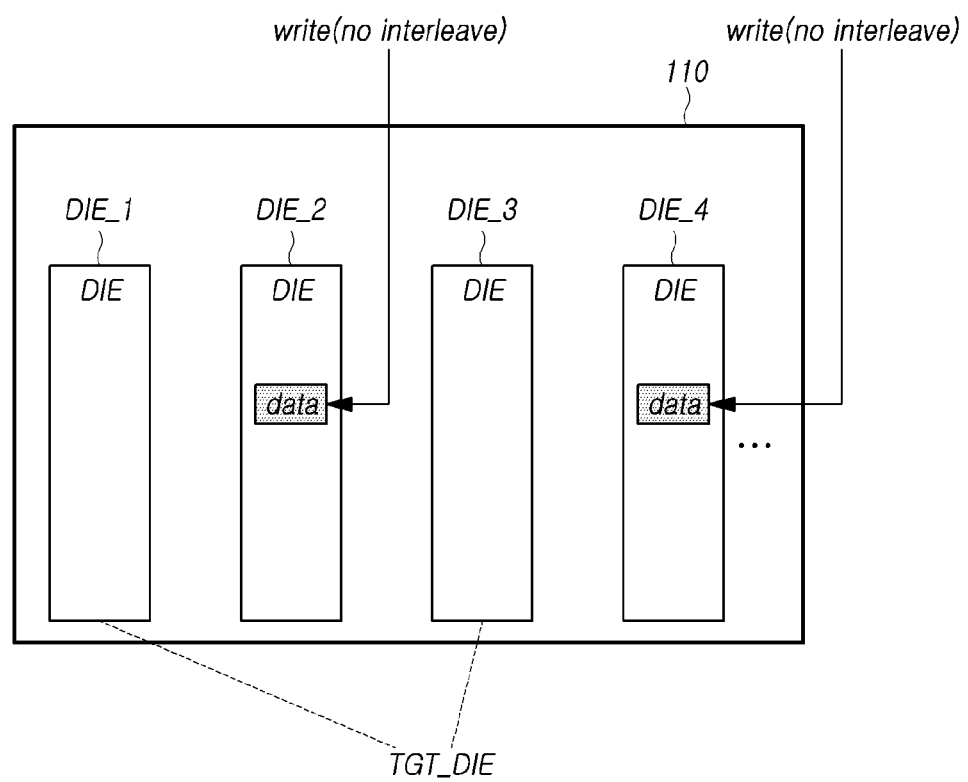
FIG. 9 illustrates an example in which data is written to memory dies other than target memory dies based on the embodiment of the disclosed technology.

FIG. 9 illustrates an example in which data is written to memory dies other than target memory dies TGT_DIE based on the embodiment of the disclosed technology.

Referring to FIG. 9, the controller 120 of the storage device 100 may not write data in the interleaving manner to memory dies whose temperatures are equal to or higher than the set threshold temperature THR among the plurality of memory dies, and, instead, may write data solely to one memory die.

In FIG. 9, among the four memory dies in the example shown, the first memory die DIE_1 and the third memory die DIE_3 are target memory dies TGT_DIE, and the second memory die DIE_2 and the fourth memory die DIE_4 are not target memory dies TGT_DIE.

Accordingly, when writing data to the second memory die DIE_2, the controller 120 may write the data solely to the second memory die DIE_2. That is, while the controller 120 is writing data to the second memory die DIE_2, the controller 120 will not be writing data to any of first memory die DIE_1, the third memory die DIE_3, and the fourth memory die DIE_4.

Similarly, when writing data to the fourth memory die DIE_4, the controller 120 may write the data solely to the fourth memory die DIE_4.

The example of FIG. 8 may be combined with the example of FIG. 9. For example, in step S440 of FIG. 4, the controller 120 may write data to a target memory die (such as first memory die DIE_1) while also writing data to one or more other target memory dies (such as third memory die DIE_3) in the interleaved manner described in FIG. 8.

Figure 10:
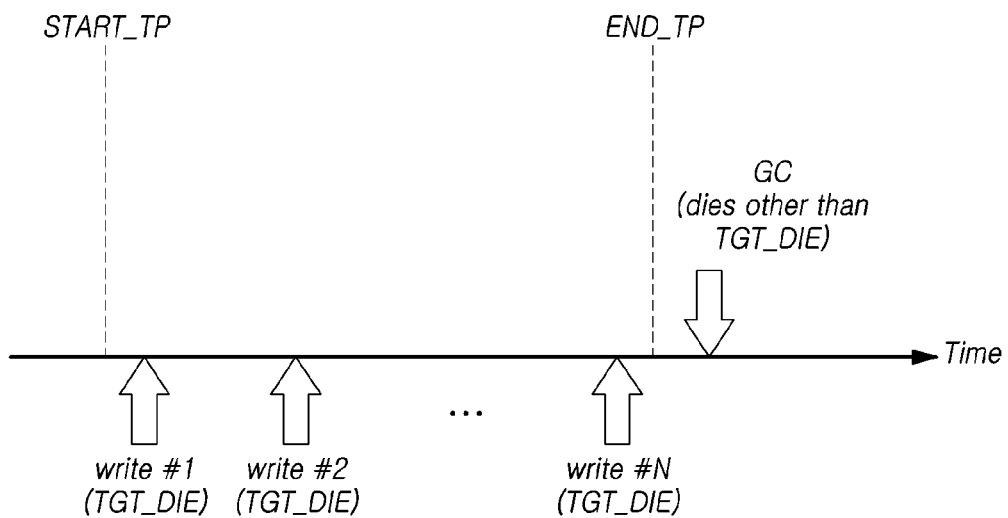
FIG. 10 illustrates an example in which the storage device based on the embodiment of the disclosed technology performs garbage collection.

FIG. 10 illustrates an example in which the storage device 100 based on the embodiment of the disclosed technology performs garbage collection.

Referring to FIG. 10, when write operations of at least a reference write count N (N is a natural number) are performed in the interleaving manner on target memory dies TGT_DIE, the controller 120 of the storage device 100 may execute garbage collection on memory dies DIE other than the target memory dies TGT_DIE among the plurality of memory dies DIE. The controller 120 may perform a write operation on the target memory dies TGT_DIE in the interleaving manner, and may execute a garbage collection operation only on the memory dies DIE other than the target memory dies TGT_DIE.

In FIG. 10, when write operations of at least the reference write count N (N is a natural number) are performed in the interleaving manner on the target memory dies TGT_DIE between a specific start time point START_TP and a specific end time point END_TP, the controller 120 may execute garbage collection on memory dies DIE other than the target memory dies TGT_DIE among the plurality of memory dies DIE.

The value of the reference write count N may be determined on the basis of the temperatures of one or more of the plurality of memory dies DIE.

For example, the reference write count N may be proportional to the average of the temperatures of one or more of the plurality of memory dies DIE. That is to say, as the average of the temperatures of one or more of the plurality of memory dies DIE increases, the value of the reference write count N may increase.

Figure 11:
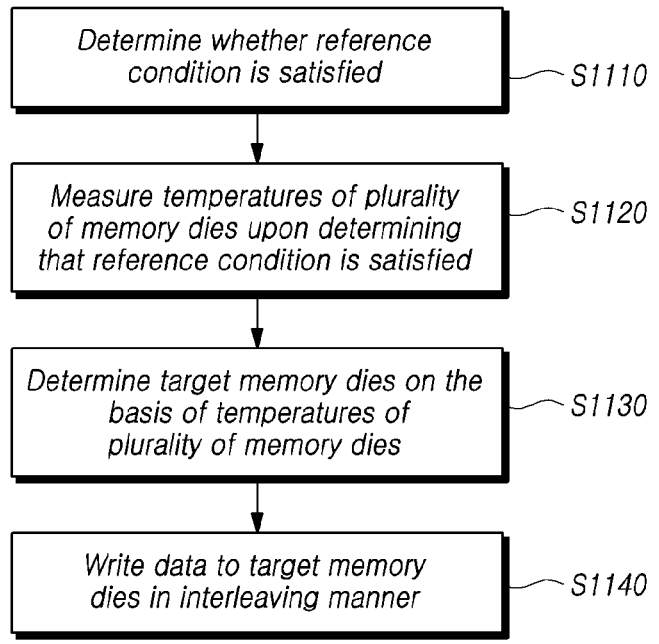
FIG. 11 illustrates a method for operating a storage device based on an embodiment of the disclosed technology.

FIG. 11 illustrates a method for operating the storage device 100 based on an embodiment of the disclosed technology.

Referring to FIG. 11, the method for operating the storage device 100 may include determining whether the set reference condition is satisfied (S1110). For example, at the step S1110, when the temperature of the storage device 100 is equal to or higher than the set threshold device temperature, it may be determined that the reference condition is satisfied.

When it is determined at the step S1110 that the reference condition is satisfied, the method for operating the storage device 100 may include measuring the temperatures of the plurality of memory dies DIE (S1120).

The method for operating the storage device 100 may include determining one or more target memory dies TGT_DIE on the basis of the temperatures of the plurality of memory dies DIE (S1130).

For example, at the step S1130, among the plurality of memory dies DIE, memory dies DIE whose temperatures are lower than the set threshold temperature may be determined as the target memory dies TGT_DIE.

For another example, at the step S1130, an average temperature value may be calculated using at least one memory die DIE among the plurality of memory dies DIE, and memory dies DIE whose temperatures are equal to or lower than the average temperature value may be determined as the target memory dies TGT_DIE. In some embodiments, a memory die DIE whose temperature is equal to or higher than a set temperature among the plurality of memory dies DIE may not be included in memory dies DIE used in calculating the average temperature value.

The method for operating the storage device 100 may include writing data to the target memory dies TGT_DIE, determined at the step S1130, in the interleaving manner (S1140).

The method for operating the storage device 100 may further include counting an interleaving write count as a count by which write operations are performed on the target memory dies TGT_DIE in the interleaving manner, and, executing, when the interleaving write count is equal to or greater than a set reference write count, garbage collection on memory dies DIE other than the target memory dies TGT_DIE among the plurality of memory dies DIE.

For example, when the first memory die DIE_1 and the third memory die DIE_3 are the target memory dies TGT_DIE, the interleaving write count may be increased when data is written to the first memory die DIE_1 and the third memory die DIE_3 in the interleaving manner.

In this case, when a count by which write operations are performed on the target memory dies TGT_DIE in the interleaving manner after a specific time point (e.g., a time point at which garbage collection is performed on the second memory die DIE_2 not belonging to the target memory dies TGT_DIE) is equal to or greater than the reference write count, garbage collection may be executed on a memory die (e.g., the fourth memory die DIE_4) that is not one of the target memory dies TGT_DIE.

The reference write count may be proportional to the average of the temperatures of one or more of the plurality of memory dies DIE.

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted in connection with the appended claims and encompass all equivalents falling within the scope of the appended claims.

What is claimed is:

1. A storage device comprising:
a plurality of memory dies; and
a controller configured to determine whether a reference condition is satisfied,
in response to determining that the reference condition is satisfied, determine one or more target memory dies among the plurality of memory dies on the basis of temperatures of the plurality of memory dies, and write data to the plurality of memory dies according to the determination of the target memory dies in an interleaving manner.

2. The storage device according to claim 1, wherein the controller determines that the reference condition is satisfied when a temperature of the storage device is equal to or higher than a set threshold device temperature.

3. The storage device according to claim 1, wherein the controller determines memory dies whose temperatures are lower than a set threshold temperature among the plurality of memory dies as the target memory dies.

4. The storage device according to claim 1, wherein the controller calculates an average temperature value using at least one memory die among the plurality of memory dies, and determines memory dies whose temperatures are equal to or lower than the average temperature value as the target memory dies.

5. The storage device according to claim 4, wherein the controller does not include a memory die whose temperature is equal to or higher than a set temperature among the plurality of memory dies in the at least one memory die used in calculating the average temperature value.

6. The storage device according to claim 1, wherein, when a count by which write operations are performed on the target memory dies in the interleaving manner is equal to or greater than a set reference write count, the controller executes garbage collection on a memory die other than the target memory dies among the plurality of memory dies.

7. The storage device according to claim 6, wherein the reference write count is proportional to an average of temperatures of one or more among the plurality of memory dies.

8. A method for operating a storage device, comprising:
measuring temperatures of a plurality of memory dies;
determining whether a reference condition is satisfied; and
in response to determining that the reference condition is satisfied:
determining one or more target memory dies on the basis of the measured temperatures, and
writing data to the target memory dies in an interleaving manner according to the determination of the one or more target memory dies.

9. The method according to claim 8, wherein determining whether the reference condition is satisfied includes determining that the reference condition is satisfied when a temperature of the storage device is equal to or higher than a threshold device temperature.

10. The method according to claim 8, wherein determining the target memory dies includes determining memory dies whose temperatures are lower than a set threshold temperature among the plurality of memory dies as the target memory dies.

11. The method according to claim 8, wherein determining the target memory dies includes:
calculating an average temperature value using respective temperatures of at least one memory die among the plurality of memory dies, and
determining memory dies whose temperatures are equal to or lower than the average temperature value as the target memory dies.

12. The method according to claim 11, wherein a memory die whose temperature is equal to or higher than a set temperature among the plurality of memory dies is not included in the at least one memory die used in calculating the average temperature value.

13. The method according to claim 8, further comprising:
counting an interleaving write count as a count by which write operations are performed on the target memory dies in the interleaving manner; and
executing garbage collection on a memory die other than the target memory dies among the plurality of memory dies when the interleaving write count is equal to or greater than a set reference write count.

14. The method according to claim 13, wherein the reference write count is proportional to an average of temperatures of one or more among the plurality of memory dies.

15. A controller comprising:
a memory interface configured to communicate with a memory, the memory including a plurality of memory dies; and
a control logic configured to:
obtain measurements of temperatures respectively corresponding to the plurality of memory dies,
determine whether a reference condition is satisfied, and
in response to the reference condition being satisfied, write a plurality of data units in parallel to memory dies whose temperatures are lower than a threshold die temperature among the plurality of memory dies.

* * * * *